(12) United States Patent
Bae et al.

(10) Patent No.: US 6,791,892 B2
(45) Date of Patent: Sep. 14, 2004

(54) METHOD OF GENERATING AN INITIALIZING SIGNAL DURING POWER-UP OF SEMICONDUCTOR MEMORY DEVICE

(75) Inventors: Il-Man Bae, Kyungki-do (KR); Jae-Hoon Kim, Kyungki-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/187,718

(22) Filed: Jul. 1, 2002

(65) Prior Publication Data

US 2003/0016581 A1 Jan. 23, 2003

(30) Foreign Application Priority Data

Jul. 18, 2001 (KR) .................................... 2001-0043111

(51) Int. Cl.[7] .............................................. G11C 7/00
(52) U.S. Cl. ...................... 365/222; 365/203; 365/233
(58) Field of Search ............................. 365/222, 203, 365/233

(56) References Cited

U.S. PATENT DOCUMENTS 5,703,475 A * 12/1997 Lee et al. ................... 323/313
5,822,766 A * 10/1998 Purdham et al. ............ 711/148
5,982,704 A * 11/1999 Kim ....................... 365/230.08
6,081,460 A * 6/2000 Lim et al. ............... 365/189.11
6,633,804 B2 * 10/2003 Dix et al. ..................... 701/50

* cited by examiner

Primary Examiner—Hoai Ho
(74) Attorney, Agent, or Firm—Marger Johnson & McCollom, P.C.

(57) ABSTRACT

A method for generating an initializing signal capable of preventing inner circuits installed in a semiconductor memory device from being initially unstably operated due to the application of external electric power. The method includes the steps of: (a) receiving a precharge command for precharging the semiconductor memory device; (b) activating the initializing signal to a first level in response to the received precharge command; (c) receiving a refresh command for refreshing the semiconductor memory device after receipt of the precharge command; (d) receiving a mode set command for setting an operational mode of the semiconductor memory device after receipt of the refresh command; and (e) deactivating the initializing signal to a second level in response to the received mode set command.

18 Claims, 6 Drawing Sheets

METHOD OF GENERATING AN INITIALIZING SIGNAL DURING POWER-UP OF SEMICONDUCTOR MEMORY DEVICE

BACKGROUND OF THE INVENTION

1. Field of the Invention

The present invention relates to a semiconductor memory device, and more particularly, to a method of generating an initializing signal capable of preventing unstable operations of inner circuits when a semiconductor memory device is powered on.

2. Description of the Related Art

Power-up is to apply external electric power to a semiconductor memory device for operating the same. A semiconductor memory device includes an initializing circuit in order to prevent inner circuits from being unstably operated during power-up. Here, the unstable operations of the inner circuits mean that whether data in a circuit is logic 'high' or logic 'low' is difficult to be determined in a power-up operation section because external electric power is not completely stabilized. The unstable operations of the inner circuits can be prevented by latching the inner circuits through an initializing signal that is temporarily logic 'high' but drops to logic 'low' during the power-up.

FIG. 1 is a view of an initializing circuit 100 capable of preventing unstable operations of inner circuits of a semiconductor memory device upon power-up. Referring to FIG. 1, the initializing circuit 100 includes a PMOS transistor MP1, a capacitor CAP, a resistor R1 and inverters I11 through I13. In the operation of the initializing circuit 100, an initializing signal VCCHB output from the initializing circuit 100 becomes larger due to an increase in a voltage level when external electric power EVC from an outer source is applied to the initializing circuit 100 and the voltage level of the external electric power EVC is raised. If the voltage level of the external electric power EVC is above a predetermined level, the voltage of the initializing circuit 100 is adjusted so that a first node N11 becomes a logic 'high' level. Once the first node N11 is recognized as logic 'high', the initializing signal VCCHB is generated to be logic 'low' by the inverters I11 through I13. Here, the initializing pulse signal VCCHB is used for preventing unstable operation of the inner circuits of a semiconductor memory device during power-up operation.

FIG. 2 shows an example of a method of initializing the inner circuits of a semiconductor memory device using an initializing signal. In the operation of the circuit shown in FIG. 2, an input signal IN is inactive during power-up, and therefore a first node N21 is in an unstable state. At this time, when a logic 'high' initializing signal VCCHB is input, a PMOS transistor MP2 is turned on by an inverter I21 and the first node N21 is latched to the logic 'high' level and stabilized. As a result, variations in an output signal OUT can be prevented. When the initializing signal VCCHB is transited to the logic 'low' level, the PMOS transistor MP2 is turned off and the first node N21 remains latched to the logic 'high' level. As described above, the initializing signal VCCHB sets each of the nodes of the inner circuit of a semiconductor memory device to a predetermined logic level upon power-up.

However, the initializing circuit 100 has problems in that it has a large layout area and consumes power while the semiconductor memory device operates, even after the initializing signal VCCHB is generated. Further, the current trend is to reduce the voltage of the external electric power EVC (to conserve power and increase speed), thus lessening a voltage level of the initializing signal VCCHB. This causes the initializing signal VCCHB to fail to fulfill the function of preventing unstable operation of the inner circuits.

In contrast, a method of generating an initializing signal according to the present invention can reduce the layout area and power consumption of an initializing circuit during power-up.

SUMMARY OF THE INVENTION

To solve the above problems, it is an objective of the present invention to provide a method of generating an initializing signal capable of reducing the layout area and power consumption of an initializing circuit during power-up.

Accordingly, to achieve the above objective, there is provided a method of generating an initializing signal according to the first embodiment of the present invention. The method includes the steps of: (a) receiving a precharge command for precharging the semiconductor memory device; (b) activating the initializing signal to a first level in response to the received precharge command; (c) receiving a refresh command for refreshing the semiconductor memory device after receipt of the precharge command; (d) receiving a mode set command for setting an operational mode of the semiconductor memory device after receipt of the refresh command; and (e) deactivating the initializing signal to a second level in response to the received mode set command.

To achieve the objective, there is provided a method for generating an initializing signal according to the second embodiment of the present invention. The method includes the steps of: (a) receiving a precharge command for precharging the semiconductor memory device; and (b) generating an automatic pulse as an initializing signal in response to the received precharge command.

To achieve the objective, there is provided a method for generating an initializing signal according to the third embodiment of the present-invention. The method includes the steps of: (a) receiving a mode set command for setting an operational mode of the semiconductor memory device; and (b) generating an automatic pulse as an initializing signal in response to the received mode set command.

To achieve the objective, there is provided a method for generating an initializing signal capable of preventing initial unstable operations of inner circuits installed in a semiconductor memory device which includes an initializing circuit for preventing the inner circuits from being initially unstably operated due to the application of external electric power, according to a fourth embodiment of the present invention. The method includes the steps of: (a) the initializing circuit generating a pre-initializing signal in response to the external electric power; (b) receiving a mode set command for setting an operational mode of the semiconductor memory device; and (c) generating an automatic pulse in response to the pre-initializing signal and the received mode set command. The method may further include step (d) of turning off the initializing circuit in response to the generated initializing signal.

To achieve the objective, there is provided a method of turning off an initializing circuit for generating an initializing signal capable for preventing inner circuits installed in a semiconductor memory device from being initially unstably operated due to application of external electric power, according to a fifth embodiment of the present invention.

The method includes the steps of: (a) the initializing circuit generating an initializing signal in response to the external electric power; (b) receiving a precharge command or precharging the semiconductor memory device; and (c) turning off the initializing circuit in response to the precharge command.

To achieve the objective, there is provided a method of turning off an initializing circuit for generating an initializing signal capable of preventing inner circuits installed in a semiconductor memory device from being initially unstably operated due to application of external electric power, according to a sixth embodiment of the present invention. The method includes the steps of: (a) the initializing circuit generating an initializing signal in response to the outer source of electric power; (b) receiving a mode set command for setting an operational mode of the semiconductor memory device; and (c) turning off the initializing circuit in response to the mode set command.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE INVENTION

Figure 1:
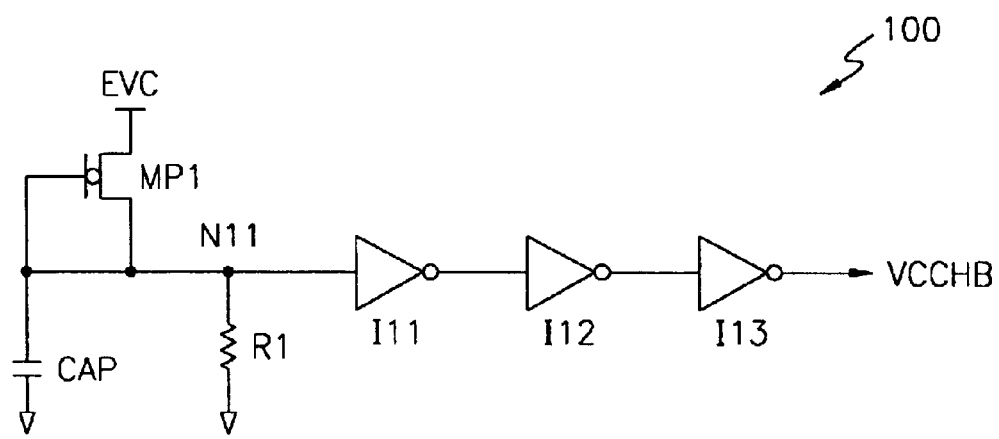
FIG. 1 is a circuit diagram of an initializing circuit capable of preventing unstable operations of inner circuits during power-up.
Figure 2:
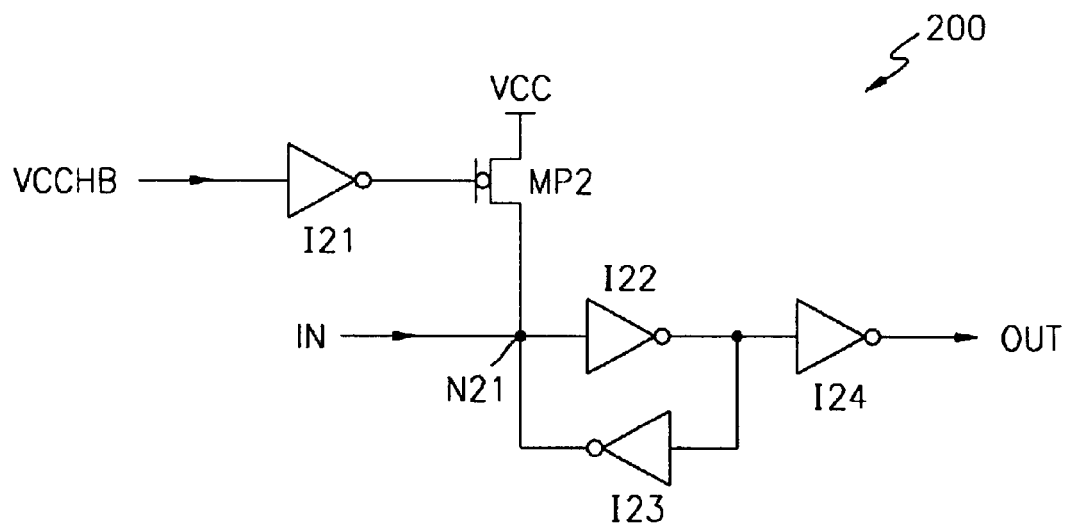
FIG. 2 is a circuit diagram of an initializing circuit that utilizes an initializing signal.

The objectives and advantages of the present invention will become apparent by describing in detail embodiments thereof with respect to the appended drawings. Like reference numerals in the drawings denote like method steps.

When external electric power EVC is applied, a semiconductor memory device sequentially receives a precharge command for precharging the semiconductor memory device, a refresh command and a mode set command. These commands are given when external electric power EVC is applied to the semiconductor memory device. When the semiconductor memory device has received these commands, it operates upon receipt of commands related to operations. The first embodiment of the present invention concerns a method of generating an initializing signal by an initializing circuit through these initial commands which are given when the external electric power EVC is applied to the semiconductor memory device.

Figure 3:
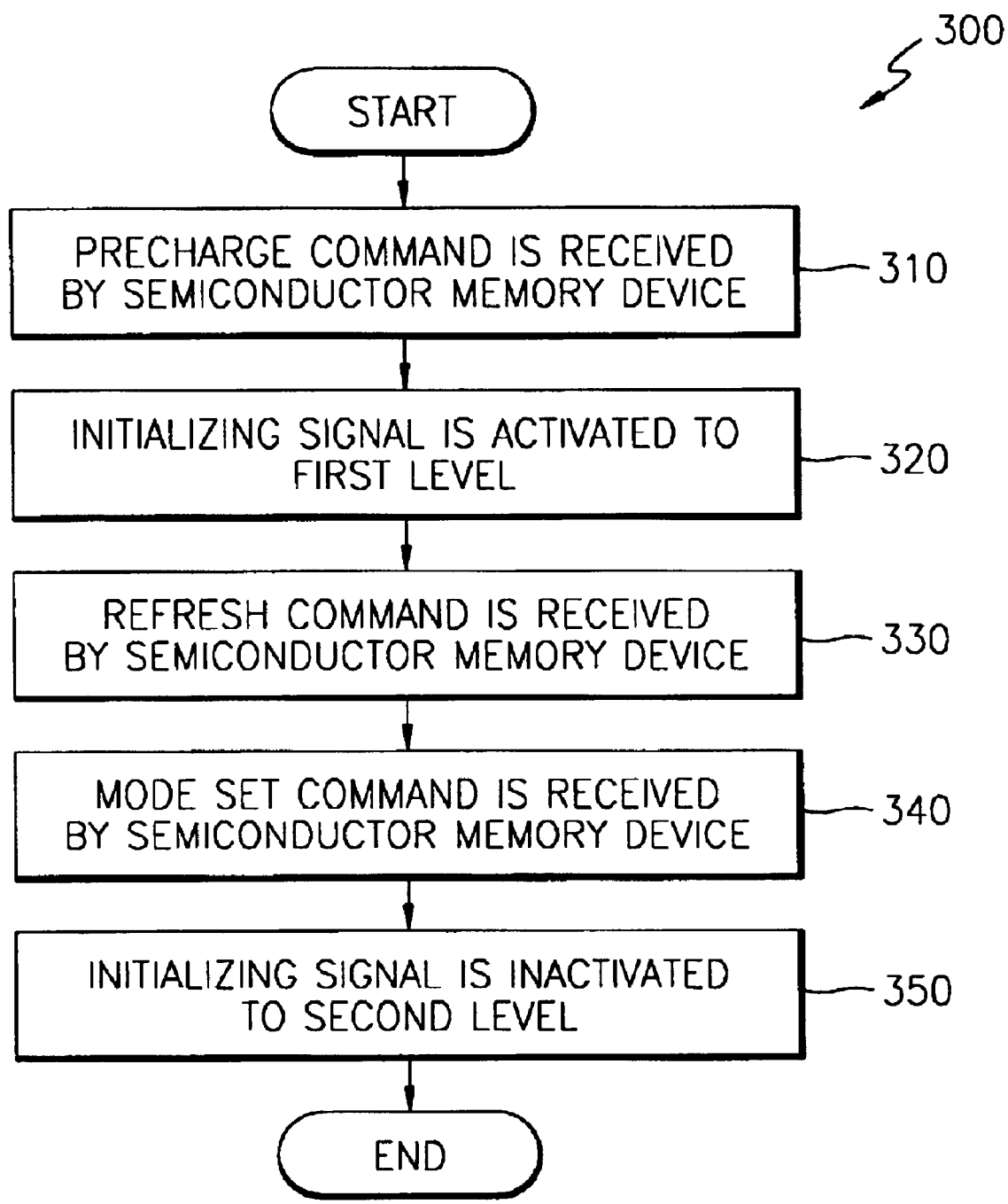
FIG. 3 is a flowchart illustrating a method of generating an initializing signal according to a first embodiment of the present invention.

Referring to FIG. 3, in a method 300 of generating an initializing signal according to the first embodiment of the present invention, a precharge command for precharging the semiconductor memory device is sent to the semiconductor memory device after external electric power is applied to the semiconductor memory device (step 310). Once the precharge command is acknowledged, a signal for precharging is generated to perform precharging operations. Apart from the precharging operations, the initializing signal is activated to a first level in response to the precharging command (step 320). The initializing signal is activated if a semiconductor memory device is configured to have a circuit in which one flag, i.e., a pulse-type signal, is generated. Here, the 'first level' may be a logic 'high' level or a logic 'low' level.

After receiving the precharge command, the semiconductor memory device receives a refresh command for refreshing itself (step 330). Then, in response to the refresh command, the semiconductor memory device is refreshed. Next, the semiconductor memory device receives a mode set command for setting an operational mode of the semiconductor memory device (step 340). The mode set command is a mode register set (MRS) command in a synchronous DRAM and a write CAS before RAS (WCBR) in an asynchronous DRAM. Then, the semiconductor memory device may receive other commands and performs operations according to the commands.

Next, according to the received mode set command, the initializing signal is deactivated to a second level (step 350). Here, the second level is logic 'low' if the first level is logic 'high', and vice versa, by which the initializing signal is characterized as a pulse signal. The pulse signal serves as an initializing signal. Therefore, according to the first embodiment of the present invention, the unstable operations of the inner circuits can be prevented without the initializing circuit, thus reducing the layout area and power consumption of the initializing circuit. Further, inner circuits otherwise operating unstably during power-up can be stabilized through the initializing signal generated according to the above commands.

Figure 4:
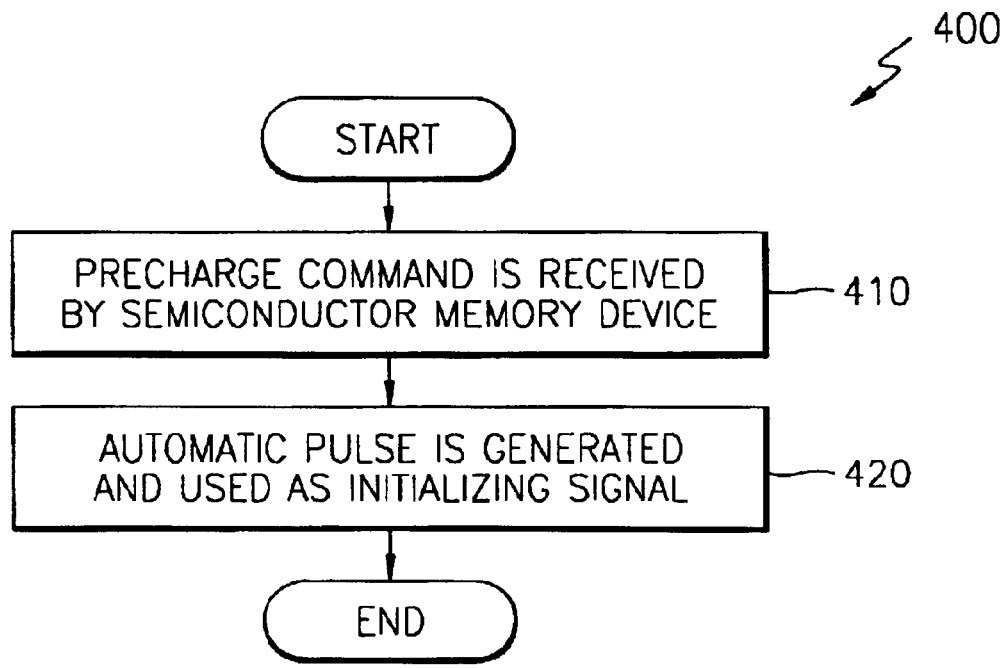
FIG. 4 is a flowchart illustrating a method of generating an initializing signal according to a second embodiment of the present invention.

Referring to FIG. 4, a method 400 of generating an initializing signal according to a second embodiment of the present invention will be described. The method according to the second embodiment of the present invention is different from that according to the first embodiment in which a single pulse signal is generated in response to a precharge command. That is, the semiconductor memory device receives the precharge command for precharging one or more banks thereof with external electric power (step 410). Next, a refresh command and a mode set command are sequentially received by the semiconductor memory device. However, in addition to these commands, the semiconductor memory device responds to the received precharge command and generates an automatic pulse used as an initializing signal (step 420). The automatic pulse can be generated by installing in the semiconductor memory device an automatic pulse generator that generates a pulse signal in response to the precharge command. The pulse signal generated by the automatic pulse generator serves as an initializing signal generated by the initializing circuit. Therefore, the method of generating an initializing signal according to the second embodiment produces the same effects as those according to the first embodiment.

Figure 5:
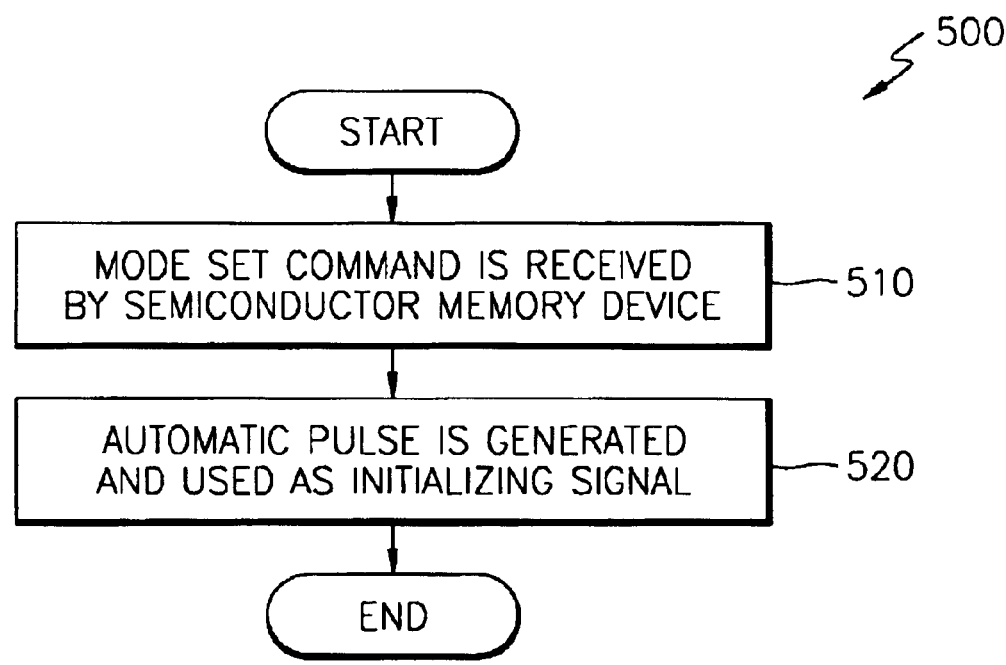
FIG. 5 is a flowchart illustrating a method of generating an initializing signal according to a third embodiment of the present invention.

Referring to FIG. 5, a method 500 for generating an initializing signal according to a third embodiment of the present invention will be described. The third embodiment is different from the first and second embodiments of the present invention in that a pulse is generated in response to a mode set command. That is, after external electric power is applied, the mode set command for setting an operational mode of a semiconductor memory device is received by the semiconductor memory device (step 510). Then, the semiconductor memory device responds to the received mode set command and generates an automatic pulse serving as an initializing signal (step 520), which can be realized if an automatic pulse generator, which generates a pulse signal in response to the mode set command, is included in the semiconductor memory device. Here, as in the first embodiment, the mode set command is a mode register set (MRS) command in a synchronous DRAM and a write CAS before RAS (WCBR) in an asynchronous DRAM. A pulse signal generated by the automatic pulse generator serves as an initializing signal generated by the initializing circuit. Therefore, the effects of the third embodiment are the same as those of the first and second embodiments.

Prior to the step 510, the method 500 for generating an initializing signal according to the third embodiment of the present invention may further include steps of receiving a precharge command for precharging the semiconductor memory device and of receiving a refresh command for refreshing the semiconductor memory device.

Figure 6:
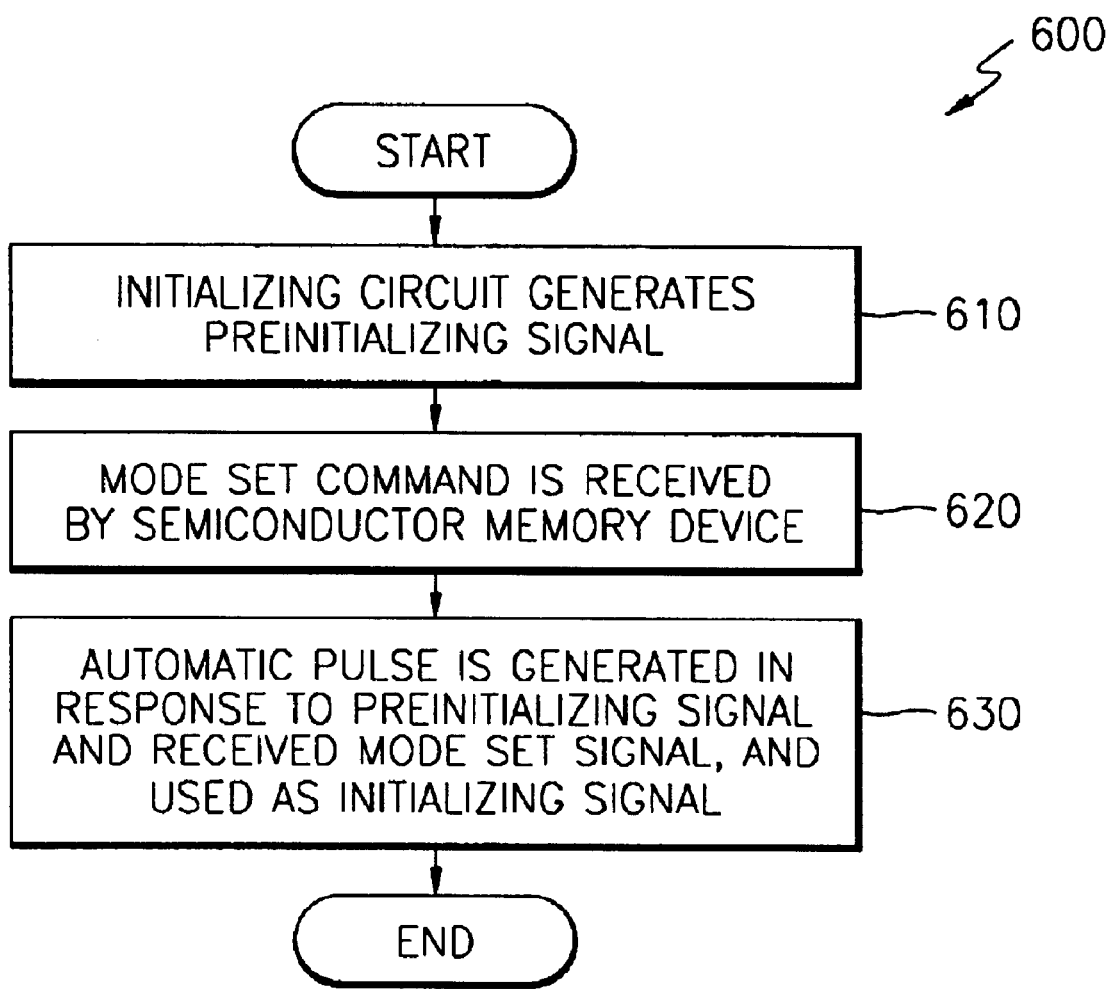
FIG. 6 is a flowchart illustrating a method of generating an initializing signal according to a fourth embodiment of the present invention.

Referring to FIG. 6, a method 600 of generating an initializing signal according to the fourth embodiment of the present invention will be described. The fourth embodiment is different from the first through third embodiments in that it further includes an initializing circuit for preventing initial unstable operations of inner circuits installed in a semiconductor memory device.

According to the method 600, an initializing circuit generates a preinitializing signal in response to external electric power (step 610). The preinitializing signal is identical with the signal VCCHB output from the initializing circuit 100 shown in FIG. 1 and stabilizes the inner circuits.

Next, the semiconductor memory device receives the mode set command (step 620) and generates an automatic pulse to be used as an initializing signal in response to the preinitializing signal and the received mode set command (step 630). This can be realized by including in the semiconductor memory device an automatic pulse generator that generates a pulse signal in response to the preinitializing signal and the mode set command. As a voltage level of external electric power EVC decreases, that of the preinitializing signal decreases. Thus, while the external electric power is applied, the inner circuits can be more reliably initialized by a pulse signal which is generated in response to both the preinitializing signal and the mode set command and serves as an initializing signal, rather than being responsive only to the preinitializing signal. Here, as in the first embodiment, the mode set command is a mode register set (MRS) command in a synchronous DRAM and a write CAS before RAS (WCBR) in an asynchronous DRAM. The method according to the fourth embodiment of the present invention further includes a step of turning off the initializing circuit in response to a generated initializing signal. Therefore, power consumption due to the flow of a constant DC current through the initializing circuit after power-up can be reduced.

Between the steps 610 and 620, the method 600 according to the fourth embodiment of the present invention may further include steps of receiving the precharge command for precharging the semiconductor memory device and of receiving the refresh command for refreshing the semiconductor memory device after the receipt of the precharge command.

Figure 7:
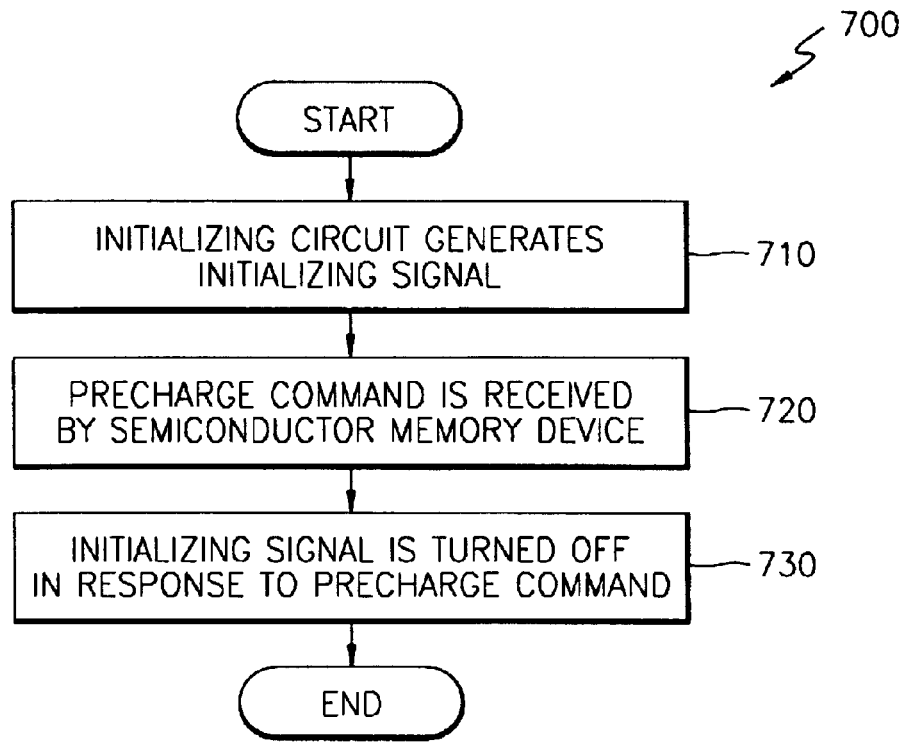
FIG. 7 is a flowchart illustrating a method of turning off an initializing circuit according to a fifth embodiment of the present invention.

FIG. 7 is a flowchart illustrating a method 700 for turning off the initializing circuit according to a firth embodiment of the present invention. In the method 700, an initializing circuit generates an initializing signal in response to external electric power applied to the semiconductor memory device (step 710). The initializing signal is equal to a signal VCCHB output from the initializing circuit 100 shown in FIG. 1 and initializes inner circuits installed in the semiconductor memory device. Then, a precharge command for precharging the semiconductor memory device is received by the semiconductor memory device (step 720). Thereafter, a refresh command and a mode set command are sequentially received by the semiconductor memory device. At this time, apart from these commands, the semiconductor memory device responds to the received precharge command and turns off the initializing circuit (step 730). This can be realized by implementing a circuit capable of turning off the initializing circuit in response to the precharge command. Thus, after power-up, it is possible to reduce power consumption caused by a constant DC current flowing in the initializing circuit.

Figure 8:
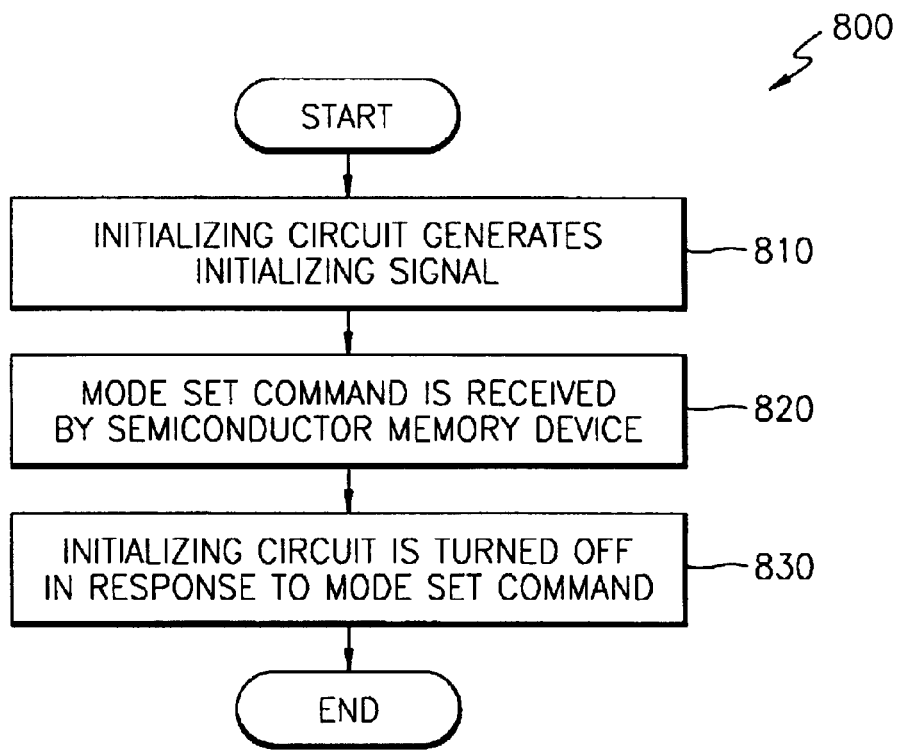
FIG. 8 is a flowchart illustrating a method of turning off an initializing circuit according to a sixth embodiment of the present invention.

In a method of turning off an initializing circuit according to a sixth embodiment of the present invention referring to FIG. 8, the initializing circuit generates an initializing signal in response to the application of external electric power (step 810). The initializing signal (which is the same as the signal VCCHB output from the initializing circuit 100 shown in FIG. 1) initializing inner circuits installed in the semiconductor memory device. Next, the semiconductor memory device receives a mode set command (step 820) and turns off the initializing circuit in response to the received mode set command (step 830). The turning off of the initializing circuit can be realized by implementing a circuit that is capable of turning off the initializing circuit in response to the mode set command. Accordingly, it is possible to reduce power consumption caused by a constant DC current flowing in the initializing circuit after power-up. Here, as in the first embodiment, the mode set command is a mode register set (MRS) command in a synchronous DRAM and a write CAS before RAS (WCBR) in an asynchronous DRAM.

Between steps 810 and 820, the method of turning off the initializing circuit according to the sixth embodiment of the present invention may further include steps of receiving the precharge command for precharging the semiconductor memory device and receiving the refresh command for refreshing the semiconductor memory device after receipt of the precharge command.

Figure 9:
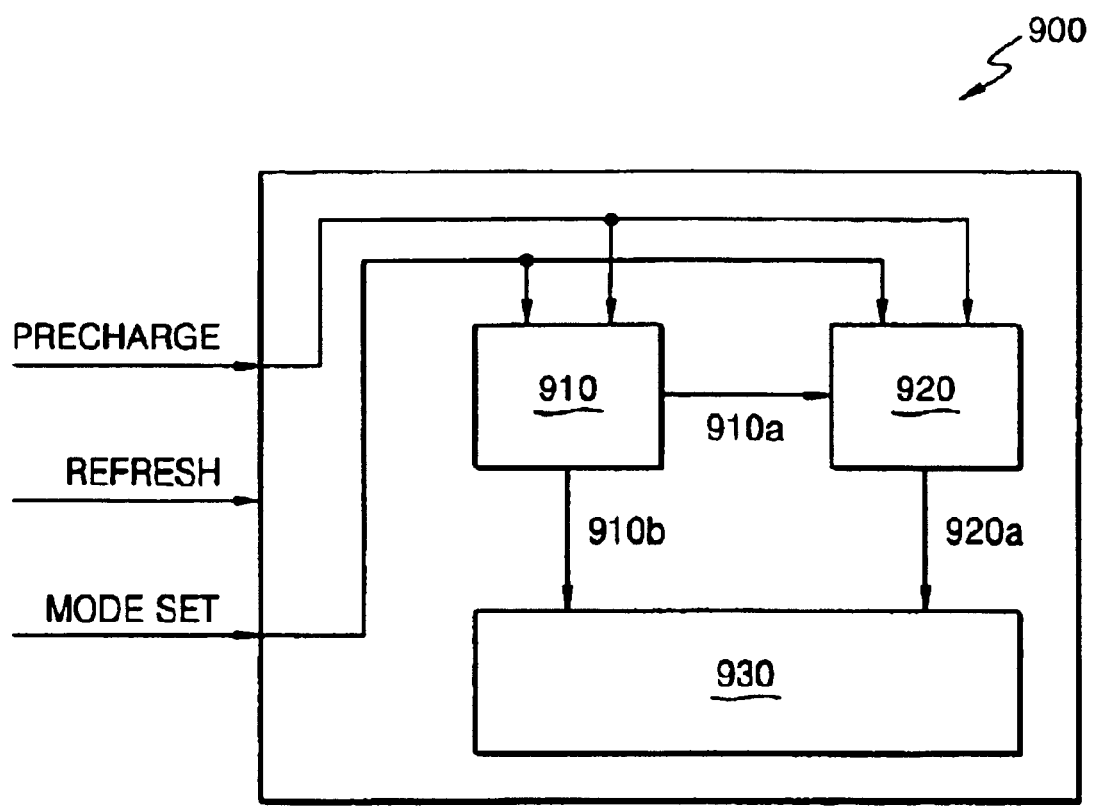
FIG. 9 is a block diagram illustrating a semiconductor memory device having an initializing circuit, an automatic pulse generator, and inner circuit according to some embodiments of the invention.

FIG. 9 is a block diagram illustrating a semiconductor memory device 900 having an initializing circuit 910, an automatic pulse generator 920, and inner circuits 930 according to some embodiments of the invention. The semiconductor memory device 900 is responsive to a precharge command, a refresh command, and a mode set command. The inner circuits 930 are responsive to an initializing signal 910b generated by the initializing circuit 910 or an automatic pulse signal 920a generated by the automatic pulse generator 920. The automatic pulse generator 920 may also be responsive to a pre-initializing signal 910a generated by the initializing circuit 910. The initializing circuit 910 may be responsive to the mode set command and the precharge command. The automatic pulse generator 920 may be responsive to the mode set command and the precharge command.

As described above, the methods for generating an initializing signal according to the present invention have advantages of reducing power consumption and the layout area that the initializing circuit, as well as providing more stable and reliable initializing operation of the initializing circuit itself.

While the present invention has been particularly shown and described with reference to the preferred embodiment thereof, the present invention is not restricted to the above embodiment. Further, it will be understood by those skilled in the art that various changes in form and details may be made without departing from the spirit and scope of the invention as defined by the appended claims.

What is claimed is:

1. A method for generating an initializing signal to initialize the inner circuits of a semiconductor memory device, the method comprising the steps of:
   (a) receiving a precharge command for precharging the semiconductor memory device;
   (b) activating the initializing signal to a first level in response to the received precharge command;
   (c) receiving a refresh command for refreshing the semiconductor memory device after receipt of the precharge command;
   (d) receiving a mode set command for setting an operational mode of the semiconductor memory device after receipt of the refresh command; and
   (e) deactivating the initializing signal to a second level in response to the received mode set command.

2. The method of claim 1, wherein the mode set command is a mode register set (MRS) command in a synchronous dynamic random access memory (DRAM).

3. The method of claim 1, wherein the mode set command is a Write Column address strobe (CAS) Before Row address strobe (RAS) (WCBR) in an asynchronous dynamic random access memory (DRAM).

4. A method of generating an initializing signal to initialize the inner circuits installed in a semiconductor memory device, the method comprising the steps of:
   (a) receiving a precharge command for precharging the semiconductor memory device; and
   (b) generating an automatic pulse as an initializing signal in response to the received precharge command.

5. A method of generating an initializing signal initiating inner circuits of a semiconductor memory device, the method comprising the steps of:
   (a) receiving a mode set command for setting an operational mode of the semiconductor memory device; and
   (b) generating an automatic pulse as an initializing signal in response to the received mode set command.

6. The method of claim 5, wherein the mode set command is a mode register set (MRS) command in a synchronous dynamic random access memory (DRAM).

7. The method of claim 5, wherein the mode set command is a Write Column address strobe (CAS) Before Row address strobe (RAS) (WCBR) in an asynchronous dynamic random access memory (DRAM).

8. The method of claim 5, wherein prior to the step (a), the method for generating an initializing signal further comprises:
   receiving a precharge command for precharging the semiconductor memory device; and
   receiving a refresh command for refreshing the semiconductor memory device after receiving the precharge command.

9. A method for generating an initializing signal to initialize the inner circuits of a semiconductor memory device, which includes an initializing circuit, the method comprising the steps of:
   (a) the initializing circuit generating a pre-initializing signal;
   (b) receiving a mode set command for setting an operational mode of the semiconductor memory device; and
   (c) generating an automatic pulse in response to the pre-initializing signal and the mode set command.

10. The method of claim 9, wherein the mode set command is a mode register set (MRS) command in a synchronous dynamic random access memory (DRAM).

11. The method of claim 9, wherein the mode set command is a Write Column address strobe (CAS) Before Row address strobe (RAS) (WCBR) in an asynchronous dynamic random access memory (DRAM).

12. The method of claim 9 further comprising a step (d) of turning off the initializing circuit in response to the generated initializing signal after the step (c).

13. The method of claim 9, between the steps (a) and (b), further comprising the steps of:
   receiving a precharge command for precharging the semiconductor memory device; and
   a refresh command for refreshing the semiconductor memory device after receiving the precharge command.

14. The method of claim 13 further comprising a step (d) of turning off the initializing circuit in response to the generated initializing signal after the step (c).

15. A method of turning off an initializing circuit for generating an initializing signal to initialize the inner circuits of a semiconductor memory device, the method comprising the steps of:
   (a) the initializing circuit generating an initializing signal;
   (b) receiving a precharge command for precharging the semiconductor memory device; and
   (c) turning off the initializing circuit in response to the precharge command.

16. A method of turning off an initializing circuit for generating an initializing signal to initialize the inner circuits of a semiconductor memory, the method comprising the steps of:
   (a) the initializing circuit generating an initializing signal;
   (b) receiving a precharge command for precharging the semiconductor memory device,
   (c) receiving a refresh command for refreshing the semiconductor memory device after receiving the precharge command;
   (d) receiving a mode set command for setting an operational mode of the semiconductor memory device; and
   (e) turning off the initializing circuit in response to the mode set command.

17. The method of claim 16, wherein the mode set command is a mode register set (MRS) command in a synchronous dynamic random access memory (DRAM).

18. The method of claim 16, wherein the mode set command is a Write Column address strobe (CAS) Before Row address strobe (RAS) (WCBR) in an asynchronous dynamic random access memory (DRAM).

* * * * *